(12) United States Patent
Abe

(10) Patent No.: US 11,424,689 B2
(45) Date of Patent: Aug. 23, 2022

(54) POWER CONVERSION DEVICE

(71) Applicant: Nissan Motor Co., Ltd., Yokohama (JP)

(72) Inventor: Keita Abe, Kanagawa (JP)

(73) Assignee: Nissan Motor Co., Ltd., Yokohama (JP)

( * ) Notice: Subject to any disclaimer, the term of this patent is extended or adjusted under 35 U.S.C. 154(b) by 0 days.

(21) Appl. No.: 16/613,567

(22) PCT Filed: Jun. 15, 2017

(86) PCT No.: PCT/JP2017/022110
§ 371 (c)(1),
(2) Date: Nov. 14, 2019

(87) PCT Pub. No.: WO2018/229929
PCT Pub. Date: Dec. 20, 2018

(65) Prior Publication Data
US 2020/0382014 A1 Dec. 3, 2020

(51) Int. Cl.
*H02M 7/00* (2006.01)
*H02M 7/5387* (2007.01)
(Continued)

(52) U.S. Cl.
CPC ......... *H02M 7/003* (2013.01); *H02M 7/5387* (2013.01); *H05K 7/1432* (2013.01);
(Continued)

(58) Field of Classification Search
CPC ...... H02M 7/003; H02M 7/5387; H02M 1/14; H02M 7/44; H02M 7/48; H05K 7/1432;
(Continued)

(56) References Cited

U.S. PATENT DOCUMENTS 6,327,165 B1 * 12/2001 Yamane ............... H02M 7/003
363/132
2002/0060906 A1 5/2002 Akiba
(Continued)

FOREIGN PATENT DOCUMENTS

| CN | 101714823 A | 5/2010 |
| CN | 106208892 A | 12/2016 |

(Continued)

*Primary Examiner* — Daniel Kessie
*Assistant Examiner* — Brian K Baxter
(74) *Attorney, Agent, or Firm* — Global IP Counselors, LLP

(57) ABSTRACT

A power conversion device includes a case, a power module, a smoothing capacitor and a high-voltage connection portion. The power module is housed in the case. The smoothing capacitor is fixed to the case by capacitor fixing bolt, and suppresses voltage fluctuations. In the high-voltage connection portion, the power module and the smoothing capacitor are electrically connected. The locations at which the smoothing capacitor is fixed to the case by the capacitor fixing bolts correspond to the capacitor fixing points. The capacitor fixing points are arranged at positions that avoid corner portions of the smoothing capacitor. The power module and the smoothing capacitor are disposed adjacent to each other at the high-voltage connection portion.

9 Claims, 7 Drawing Sheets

(51) Int. Cl.
  *H05K 7/14* (2006.01)
  *B60L 53/20* (2019.01)
  *B60L 50/64* (2019.01)
  *H02P 27/06* (2006.01)

(52) U.S. Cl.
  CPC ............... *B60L 50/64* (2019.02); *B60L 53/20* (2019.02); *H02P 27/06* (2013.01)

(58) Field of Classification Search
  CPC .......... B60L 50/64; B60L 53/20; H02P 27/06; Y02T 10/70; Y02T 10/7072; Y02T 90/14
  See application file for complete search history.

(56) References Cited

U.S. PATENT DOCUMENTS

| | | | | |
|---|---|---|---|---|
| 2003/0067749 | A1* | 4/2003 | Tamba | H05K 7/20927 361/699 |
| 2003/0090915 | A1* | 5/2003 | Nakamura | H02M 7/003 363/37 |
| 2008/0130223 | A1* | 6/2008 | Nakamura | H02M 7/003 361/689 |
| 2008/0180979 | A1 | 7/2008 | Taylor et al. | |
| 2008/0251909 | A1* | 10/2008 | Tokuyama | H01L 23/473 257/706 |
| 2009/0002956 | A1* | 1/2009 | Suwa | B60L 50/16 361/728 |
| 2011/0006718 | A1* | 1/2011 | Teshima | H05K 3/284 318/494 |
| 2011/0188279 | A1* | 8/2011 | Aiba | H05K 7/20 363/141 |
| 2011/0189035 | A1* | 8/2011 | Nakagami | F04B 39/06 417/410.5 |
| 2012/0044640 | A1* | 2/2012 | Harada | H05K 7/20909 361/688 |
| 2012/0300521 | A1* | 11/2012 | Hida | H05K 7/1432 363/131 |
| 2013/0033914 | A1* | 2/2013 | Yahata | H02M 7/48 363/132 |
| 2013/0070502 | A1* | 3/2013 | Suzuki | H02M 7/003 363/131 |
| 2013/0121052 | A1* | 5/2013 | Yamaura | H02M 7/003 363/131 |
| 2013/0272046 | A1* | 10/2013 | Matsuoka | H02M 7/5387 363/132 |
| 2013/0308257 | A1 | 11/2013 | Kosugi et al. | |
| 2014/0111003 | A1* | 4/2014 | Imai | B60L 3/0084 307/10.1 |
| 2014/0140119 | A1* | 5/2014 | Shinohara | H01L 24/40 363/141 |
| 2014/0240946 | A1* | 8/2014 | Fukumasu | B60L 58/20 361/811 |
| 2014/0369099 | A1* | 12/2014 | Asako | H02M 7/797 363/97 |
| 2015/0055386 | A1* | 2/2015 | Nishikimi | H02M 7/219 363/132 |
| 2015/0173244 | A1* | 6/2015 | Nakanishi | H05K 7/20927 312/223.1 |
| 2016/0241136 | A1* | 8/2016 | Nakashima | H02M 1/44 |
| 2016/0294301 | A1* | 10/2016 | Yokoyama | H05K 7/20927 |
| 2017/0194873 | A1* | 7/2017 | Takahashi | H01L 23/552 |
| 2017/0223859 | A1* | 8/2017 | Matsuo | H02M 7/003 |
| 2017/0250619 | A1* | 8/2017 | Ishii | H05K 5/0017 |
| 2018/0048127 | A1* | 2/2018 | Liang | H02B 1/20 |
| 2018/0054137 | A1* | 2/2018 | Endo | H05K 7/1432 |
| 2018/0092162 | A1* | 3/2018 | Kanai | H05B 6/06 |
| 2018/0358903 | A1* | 12/2018 | Takahashi | H01L 23/46 |
| 2020/0021202 | A1* | 1/2020 | Okaura | H05K 7/1432 |
| 2020/0281087 | A1* | 9/2020 | Schmid | H05K 7/2089 |
| 2021/0112689 | A1* | 4/2021 | Hashii | H05K 7/2039 |
| 2021/0135598 | A1* | 5/2021 | Nakashima | H02M 7/003 |

FOREIGN PATENT DOCUMENTS

| | | |
|---|---|---|
| CN | 206135120 U | 4/2017 |
| JP | 2000-152656 A | 5/2000 |
| JP | 2009-106046 A | 5/2009 |
| JP | 2013-9581 A | 1/2013 |
| JP | 2014-11339 A | 1/2014 |
| JP | 2015-220858 A | 12/2015 |
| JP | 2016-52183 A | 4/2016 |
| JP | 2017-73920 A | 4/2017 |

\* cited by examiner

POWER CONVERSION DEVICE

CROSS-REFERENCE TO RELATED APPLICATIONS

This application is a U.S. national stage application of International Application No. PCT/JP2017/022110, filed on Jun. 15, 2017.

BACKGROUND

Technical Field

The present disclosure relates to a power conversion device.

Background Information

In a conventional power conversion device, a semiconductor module and a capacitor are arranged in adjacent positions. The capacitor is square-shaped and fixed to a case of the power conversion device by means of bolts. The bolts are fastened, for example, at the four corners of the capacitor (for example, refer to Japanese Laid-Open Patent Application No. 2013-9581-Patent Document 1).

SUMMARY

However, in a conventional power conversion device, since the four corners of the capacitor serve as points for fixing the capacitor by the attachment of bolts, the space for a tool must be provided between the semiconductor module and the capacitor. For this reason, there is the problem that the volume, and thus the size, of the power conversion device increase.

In view of the problem described above, the object of the present disclosure is to achieve the downsizing of a power conversion device.

A power conversion device according to the present disclosure which achieves the object described above comprises a case, a semiconductor module, a smoothing capacitor, and a high-voltage connection portion. The semiconductor module is housed in the case. The smoothing capacitor is arranged parallel to the semiconductor module, is fixed to the case by fixing bolts and suppresses voltage fluctuations. The semiconductor module and the smoothing capacitor are electrically connected at the high-voltage connection portion. The locations at which the smoothing capacitor is fixed to the case with the fixing bolts are capacitor fixing points, the capacitor fixing points are arranged at positions that avoid the corner portions of the smoothing capacitor. The semiconductor module has a bus bar that is electrically connected by fastening bolts at bus bar fastening points to the high-voltage connection portion. The bus bar fastening points serves both as electrical connections and as the capacitor fixing points.

By bringing the semiconductor module and the smoothing capacitor close to each other in the high-voltage connection portion in this manner, it is possible to realize the downsizing of the power conversion device.

DETAILED DESCRIPTION OF THE EMBODIMENTS

Figure 1:
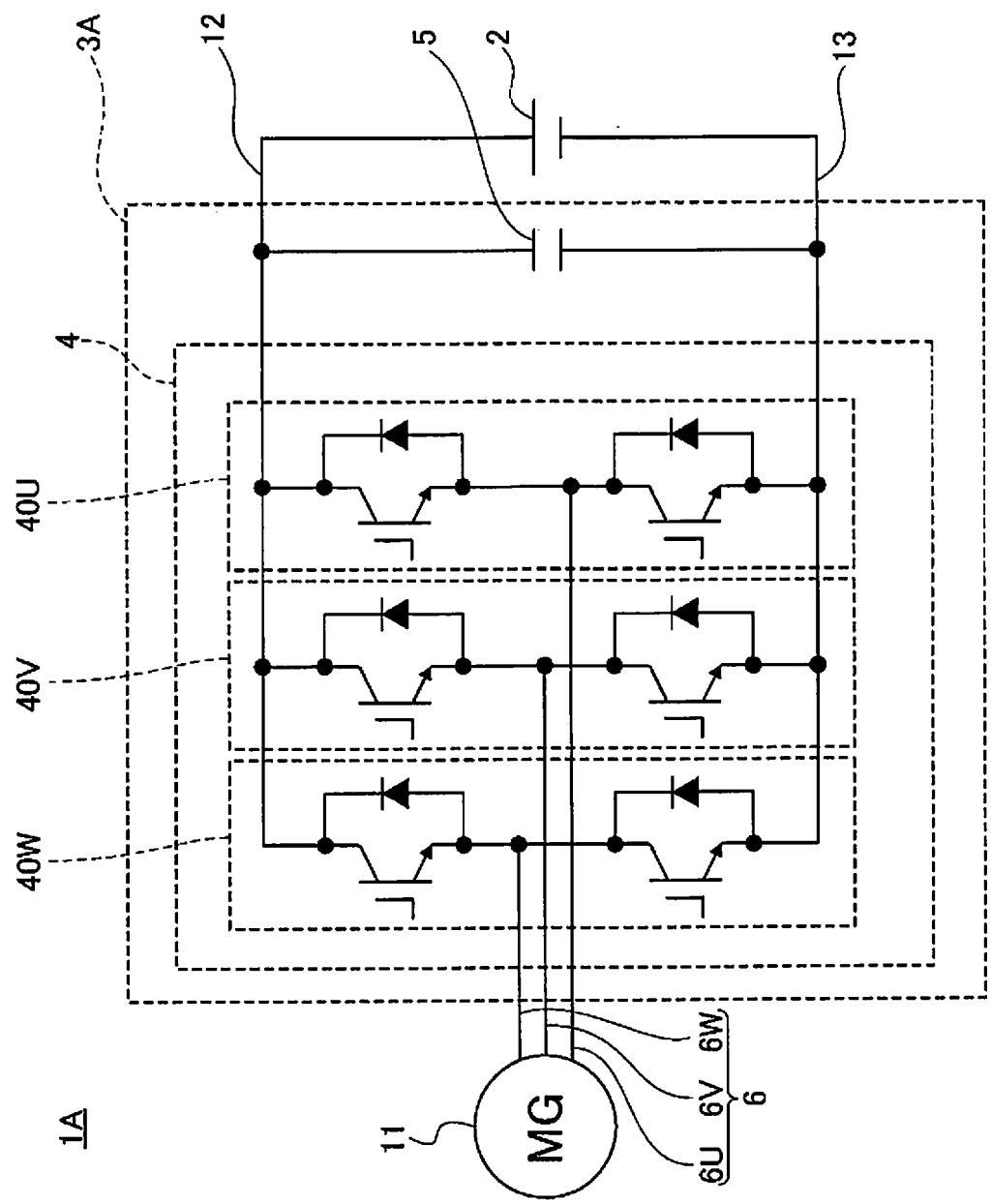
FIG. 1 is a circuit diagram of a drive system to which an inverter device according to a first embodiment is applied.

Preferred embodiments for realizing a power conversion device according to the present invention will be described below with reference to Embodiments 1 and 2 illustrated in the drawings.

First Embodiment

The configuration will be described first. The power conversion device according to the first embodiment is applied to an inverter device (one example of a power conversion device) of a motor/generator that is mounted in an electric vehicle (one example of an electrically driven vehicle) as a travel drive source, or the like. The "circuit configuration of the drive system," the "configuration of the inverter device," and the "configuration of the main components" will be described separately below in regard to the configuration of the first embodiment.

Circuit Configuration of the Drive System

FIG. 1 illustrates a circuit diagram of a drive system of an electric vehicle to which an inverter device according to a first embodiment is applied. The circuit configuration of the drive system according to the first embodiment will be described below with reference to FIG. 1.

The drive system 1A comprises a DC power source 2 (high-power battery), an inverter device 3A, and a motor/generator 11.

The DC power source 2 is a high-voltage drive battery for electric vehicles, and includes a battery (not shown) in which a plurality of secondary batteries are connected in series or in parallel. The DC power source 2 outputs a DC voltage between a P bus bar 12 (plus, positive) and an N bus bar 13 (minus, negative).

The inverter device 3A converts DC power supplied from the DC power source 2 into AC power and outputs the converted electric power to the motor/generator 11. In addition, the inverter device 3A converts the AC power generated by the motor/generator 11 into DC power and outputs the converted electric power to the DC power source 2. The inverter device 3A includes a power module 4 (semiconductor module), a smoothing capacitor 5, and a three-phase line 6.

The power module 4 includes a plurality of switch groups composed of a plurality of modularized switching elements, such as IGBTs (Insulated-Gate Bipolar Transistors) or MOSFETs (metal-oxide-semiconductor field-effect transistors), on a substrate. The DC power from the DC power source 2 is converted by switching the switching elements ON and OFF based on a control signal from a controller, which is not shown, and the AC power is output to the motor/generator 11 through the three-phase line 6. In addition, the power module 4 converts the DC power of the regenerative power (AC power) of the motor/generator 11 by means of a regenerative operation of the motor/generator 11, which is supplied to the DC power source 2; thus, the DC power source 2 is charged by the regenerative power of the motor/generator 11.

The motor/generator 11 is electrically connected to the AC side of the power module 4 via the three-phase line 6. The smoothing capacitor 5 is electrically connected to the DC side of the power module 4. The power module 4 comprises a plurality of the switching elements and a plurality of diodes. Transistors such as IGBTs or MOSFETs are used as the switching elements. The diodes are freewheeling diodes. The switching elements and the diodes are connected in parallel with the current conduction directions oriented opposite to each other. A circuit in which a plurality of parallel circuits of the switching elements and the diodes are connected in series becomes each arm circuit 40U, 40V, 40W of each of the U, V, and W phases. The plurality of arm circuits 40U, 40V, 40W are connected in parallel between the P bus bar 12 and the N bus bar 13.

The smoothing capacitor 5 smooths voltage fluctuations. The smoothing capacitor 5 suppresses voltage fluctuations by charging when the voltage is high and discharging when the voltage is low. That is, the smoothing capacitor 5 smooths the input/output voltages of the DC side of the U, V, and W phase arm circuits 40U, 40V, 40W. The smoothing capacitor 5 is connected between the P bus bar 12 and the N bus bar 13.

The three-phase line 6 includes conductive U, V, and W phase bus bars 6U, 6V, 6W. The U, V, and W phase bus bars 6U, 6V, 6W electrically connect each of the U, V, and W phase arm circuits 40U, 40V, 40W with a stator coil of each phase of the motor/generator 11.

The motor/generator 11 is a synchronous motor, for example, in which a permanent magnet is embedded in a rotor, and a stator coil is wound around the stator. The motor/generator 11 is connected to an axle of a vehicle and is operated by means of electromagnetic action to generate rotational force via electrical power supplied from the inverter device 3A.

Configuration of the Inverter Device

Figure 2:
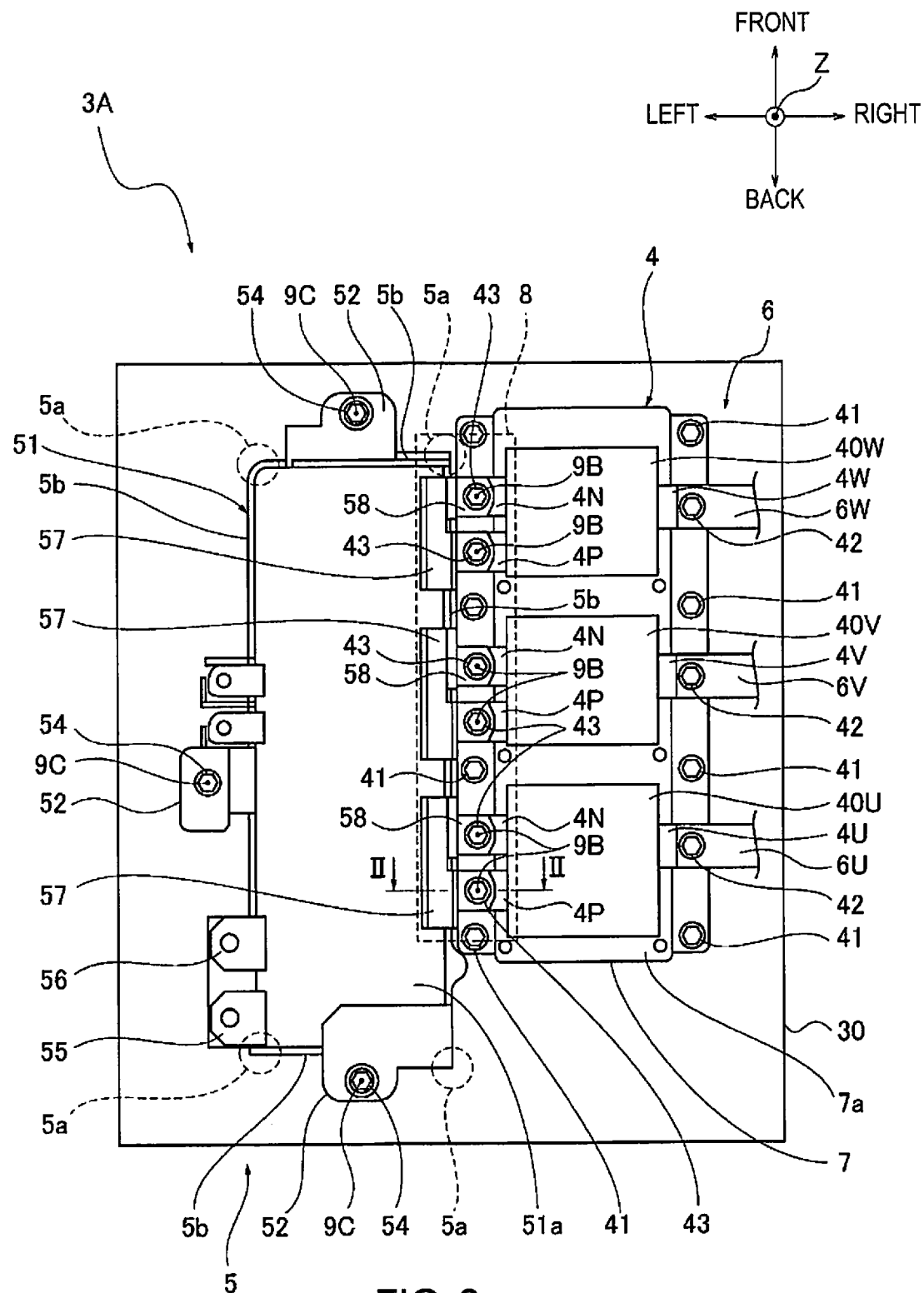
FIG. 2 is a plan view of the inverter device according to the first embodiment.

FIG. 2 is a plan view of the inverter device according to the first embodiment. The inverter device 3A according to the first embodiment will be described below with reference to FIG. 2.

The inverter device 3A has a case 30 for housing the power module 4, and the like. FIG. 2 shows only the bottom surface of the case 30. The case 30 is disposed, for example, in a position above the motor/generator 11. The power module 4, the smoothing capacitor 5, the three-phase line 6, a circuit board 7, a high-voltage connection portion 8, the P bus bar 12, and the N bus bar 13 are housed inside this case 30. The case 30 is made of metal, for example.

The power module 4 is arranged in parallel with the smoothing capacitor 5 and is fixed to the case 30 by PM fixing bolts 41. The U, V, and W phase arm circuits 40U, 40V, 40W are mounted on the upper surface 7a of the circuit board 7. The U, V, and W phase arm circuits 40U, 40V, 40W are arranged in a line (front-rear direction). In addition, a cooler, which is not shown, is provided below the circuit board 7 in the Z direction (direction orthogonal to the plane of the paper in FIG. 2, vertical direction). The cooler has a refrigerant flow path through which a refrigerant (such as cooling water) flows. The power module 4 is cooled by means of heat exchange between the refrigerant and heat generated when the power module 4 is driven. For example, the cooling method of the power module 4 is a direct cooling type (direct water cooling structure). The cooling method of the power module 4 may also be an indirect cooling type (indirect water cooling structure) or a cooler integrated type.

Each phase terminal 4U, 4V, 4W of each of the U, V, and W phase arm circuits 40U, 40V, 40W is provided on the right side of the each of the U, V, and W phase arm circuits 40U, 40V, 40W. Each of the U, V, and W phase terminals 4U, 4V, 4W is connected to each of the U, V, and W phase arm circuits 40U, 40V, 40W. An AC fastening bolt insertion hole (not shown) into which an AC fastening bolt 42 is inserted is formed in one end of each of the U, V, and W phase bus bars 6U, 6V, 6W and each of the U, V, and W phase terminals 4U, 4V, 4W. In addition, in the power module 4, an AC hole portion, which is not shown, is formed below the AC fastening bolt insertion hole of each of the terminals 4U, 4V, 4W in the Z direction. Therefore, the AC fastening bolt 42 is inserted into two AC fastening bolt insertion holes of one terminal and one bus bar and bolted to the AC hole portion. That is, each of the terminals 4U, 4V, 4W and each of the bus bars 6U, 6V, 6W are fixed to the power module 4 by the AC fastening bolt 42. The other end of each of the U, V, and W phase bus bars 6U, 6V, 6W is connected to each of a U-phase, a V-phase, and a W-phase of the stator coil of the motor/generator 11, not shown. The power module 4 and the motor/generator 11 are thereby connected.

A PN terminal 4P, 4N corresponding to each of the U, V, and W phase arm circuits 40U, 40V, 40W is provided on the left side of each of the U, V, and W phase arm circuits 40U, 40V, 40W. This PN terminal 4P, 4N is connected to each of the U, V, and W phase arm circuits 40U, 40V, 40W, where one P terminal 4P and one N terminal 4N constitutes a pair. A terminal side insertion hole 4H through which a DC fastening bolt 43 (fastening bolt) is inserted is formed on the PN terminal 4P, 4N (refer to FIG. 4). In addition, in the power module 4, a DC hole portion 44 (refer to FIG. 4) is formed below the terminal side insertion hole 4H of each terminal 4P, 4N. Six DC hole portions 44 are formed in the power module 4.

The smoothing capacitor 5 is disposed on the left side of the power module 4. The smoothing capacitor 5 is provided between the power module 4 and the DC power source 2, which is not shown. This smoothing capacitor 5 includes a power source P bus bar 55, a power source N bus bar 56, a direct current P bus bar 57, and a direct current N bus bar 58. The power source P bus bar 55 and the power source N bus bar 56 are connected to the DC power source 2, which is not shown. The direct current P bus bar 57 and the direct current N bus bar 58 are fastened with the PN terminal 4P, 4N and the DC fastening bolt 43 that correspond to each of the U, V, and W phases. The power module 4 and the smoothing capacitor 5 are thereby electrically connected. The portion where the power module 4 and the smoothing capacitor 5 are electrically connected is the high-voltage connection portion 8. The connection between the power module 4 and the smoothing capacitor 5 will be described further below. Here, the power source P bus bar 55 and the direct current P bus bar 57 constitute the P bus bar 12, and the power source N bus bar 56 and the direct current N bus bar 58 constitute the N bus bar 13.

Configuration of the Main Components

Figure 3:
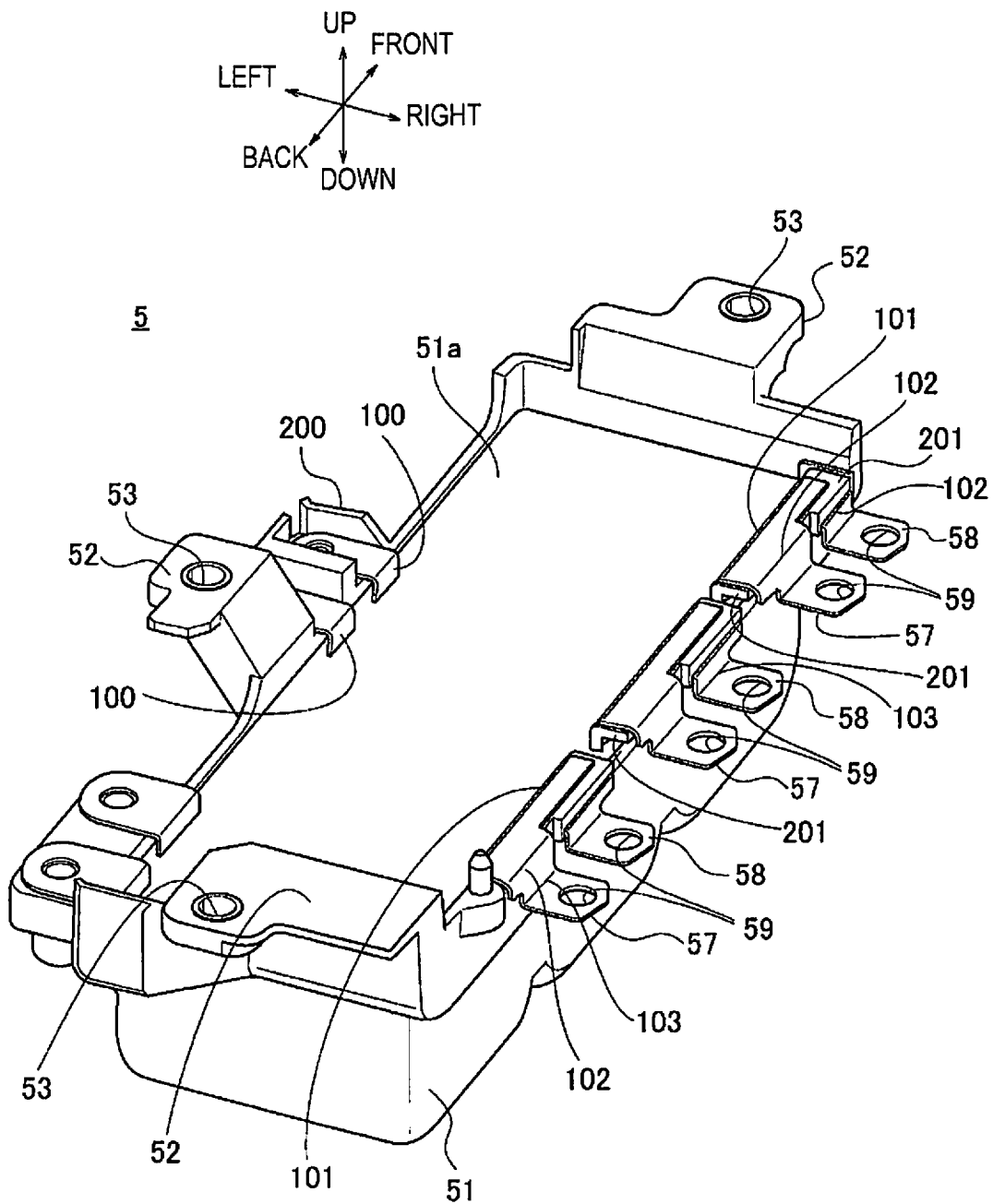
FIG. 3 is a perspective view of a smoothing capacitor according to the first embodiment.
Figure 4:
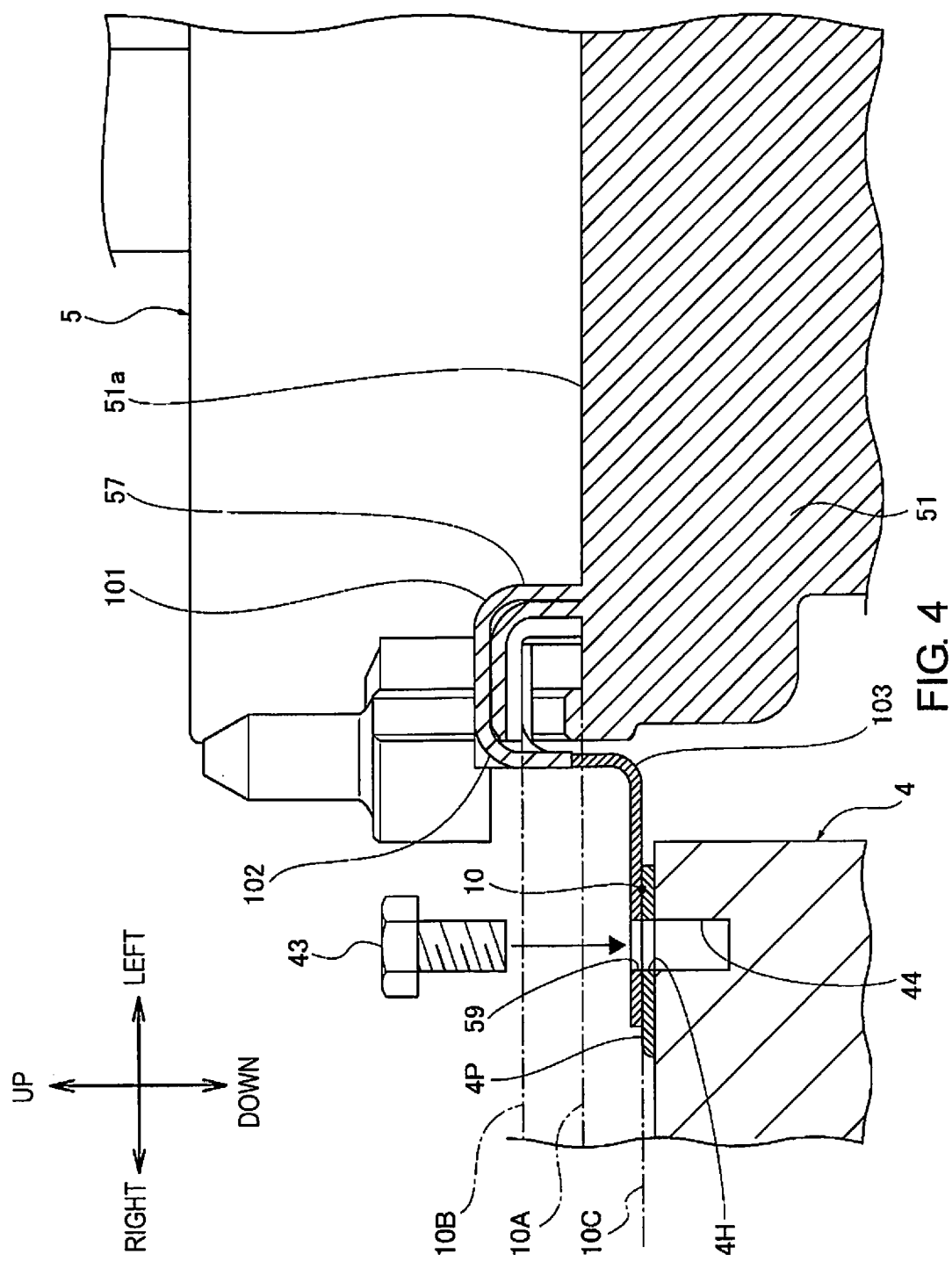
FIG. 4 is a schematic cross-sectional view explaining the connection between the power module and the smoothing capacitor of Embodiments 1-2, and a schematic cross-sectional view illustrating a cross section taken along line II-II of FIG. 2, line III-III of FIG. 7, or line IV-IV of FIG. 7.

FIG. 3 is a perspective view of the smoothing capacitor according to the first embodiment. FIG. 4 is a schematic cross-sectional view explaining the connection between the power module and the smoothing capacitor according to the first embodiment. The main components of the first embodiment will be described below with reference to FIGS. 2 to 4.

As shown in FIG. 3, the smoothing capacitor 5 includes a rectangular parallelepiped capacitor body 51, three capacitor fixing portions 52, the power source P bus bar 55, the power source N bus bar 56, the direct current P bus bar 57, and the direct current N bus bar 58.

As shown in FIG. 2, the capacitor body 51 has a rectangular shape in plan view. As shown in FIG. 4, the height position (position in the vertical direction) of an upper surface 51a (extension surface) of the capacitor body 51 is a close position (nearby position) of the height position (vertical position) of a bus bar fastening surface 10. Here, the "bus bar fastening surface 10" is a surface on which the P terminal 4P and the direct current P bus bar 57 are fastened (refer to FIG. 4) or a surface on which the N terminal 4N and the Direct current N bus bar 58 are fastened. In addition, "close position" refers to a prescribed range in which resistance (contact resistance) is required at the time of contact between the P terminal 4P and the direct current P bus bar 57 or the contact between the N terminal 4N and the direct current N bus bar 58. For example, the range of this "close position" is the range from an upper nearby position 10B to a lower nearby position 10C, as shown in FIG. 4. This "close position" does not include a position 10A in which the height position of the bus bar fastening surface 10 is the same (same position) as the height position of the upper surface 51a. In addition, in general, the resistance at the time of contact (contact resistance) is minimized by making the height position of the bus bar fastening surface 10 and the height position of the upper surface 51a the same.

As shown in FIGS. 2 and 3, one each of the capacitor fixing portions 52 is provided at the outer peripheral position of each of the front, rear, and left sides 5b of the capacitor body 51. The capacitor fixing portions 52 are provided at the outer peripheral positions of the three sides 5b from among the four sides 5b of the smoothing capacitor 5. That is, the capacitor fixing portions 52 are disposed at positions that avoid corner portions 5a of the smoothing capacitor 5. As shown in FIG. 3, a fixing bolt insertion hole 53 is formed in each of the capacitor fixing portions 52. As shown in FIG. 2, a capacitor fixing bolt 54 (fixing bolt) is inserted in each of the fixing bolt insertion holes 53. The capacitor fixing bolt 54 is bolted to a case hole portion, which is not shown, formed in the case 30. The smoothing capacitor 5 is fixed to the case 30 by these capacitor fixing bolts 54. Here, the positions in which the smoothing capacitor 5 is fixed to the case 30 by the capacitor fixing bolts 54 are defined as capacitor fixing points 9C.

As shown in FIGS. 2 and 3, the power source P bus bar 55 and the power source N bus bar 56 extend out from the upper surface 51a of the capacitor body 51. The shape of the power source P bus bar 55 will now be described. As shown in FIG. 3, the power source P bus bar 55 has a power source side bent portion 100 that extends upward from the upper surface 51a in the vertical direction and is bent in the middle in the horizontal direction. The power source P bus bar 55 extends horizontally from the power source side bent portion 100 to a terminal block 200 of the smoothing capacitor 5. The shape of the power source N bus bar 56 will now be described. The power source N bus bar 56 has the power source side bent portion 100 in the same manner as the power source P bus bar 55. In addition, the power source N bus bar 56 extends horizontally from the power source side bent portion 100 to the terminal block 200. The power source P bus bar 55 and the power source N bus bar 56 are connected to a bus bar that extends from the DC power source 2, which is not shown.

As shown in FIG. 3, the direct current P bus bar 57 and the direct current N bus bar 58 extend out from the right side of the upper surface 51a of the capacitor body 51. The extended direct current P bus bar 57 and the direct current N bus bar 58 extend toward the right side. That is, as shown in FIG. 2, the direct current P bus bar 57 and the direct current N bus bar 58 extend from the smoothing capacitor 5 to the power module 4. In addition, three each of the direct current P bus bar 57 and the direct current N bus bar 58 extend out corresponding to each of the U, V, and W phases. As shown in FIG. 3, a resin portion 201 is formed between the direct current P bus bar 57 and the direct current N bus bar 58. Contact between the direct current P bus bar 57 and the direct current N bus bar 58 is prevented by means of this resin portion 201.

The shape of the direct current P bus bar 57 will now be described. As shown in FIG. 4, the direct current P bus bar 57 has a first bent portion 101 that extends upward from the upper surface 51a in the vertical direction and is bent in the middle in the horizontal direction (right side). The direct current P bus bar 57 has a second bent portion 102 that extends from the first bent portion 101 in the horizontal direction and is bent downward in the middle in the vertical direction. The direct current P bus bar 57 has a third bent portion 103 that extends from the second bent portion 102 in the vertical direction and is bent in the middle in the horizontal direction (right side) on the opposite side of the first bent portion 101 (opposite side of the direction in which the first bent portion 101 is positioned). The direct current P bus bar 57 extends in the horizontal direction from the third bent portion 103 to the P terminal 4P of the power module 4. In addition, as shown in FIGS. 2 and 3, the width of the direct current P bus bar 57 in the front-rear direction is formed to be wide from the upper surface 51a to the second bent portion 102 and formed to be narrow from the second bent portion 102 to the P terminal 4P of the power module 4. Moreover, as shown in FIG. 3, a bus bar side insertion hole 59 into which the DC fastening bolt 43 is inserted is formed in the direct current P bus bar 57.

The shape of the direct current N bus bar 58 will now be described. Like the direct current P bus bar 57, the direct current N bus bar 58 has the first bent portion 101, the second bent portion 102, and the third bent portion 103. The direct current N bus bar 58 extends in the horizontal direction from the third bent portion 103 to the N terminal 4N of the power module 4. Unlike the direct current P bus bar 57, the width of the direct current N bus bar 58 in the front-rear direction is formed to be the same from the upper surface 51a to the P terminal 4P of the power module 4. Moreover, as shown in FIG. 3, the bus bar side insertion hole 59 into which the DC fastening bolt 43 is inserted is formed in the direct current N bus bar 58.

As shown in FIG. 2, the direct current P bus bar 57 and the direct current N bus bar 58 are connected to the PN terminals 4P, 4N that correspond to each of the U, V, and W phases at the high-voltage connection portion 8. Here, the high-voltage connection portion 8 includes the portion in which the PN terminal 4P, 4N, the direct current P bus bar 57, and the direct current N bus bar 58 are disposed and includes the portion in which the power module 4 and the smoothing capacitor 5 are electrically connected. That is, the range of the high-voltage connection portion 8 is from the U-phase N terminal 4N to the W-phase P terminal 4P in the front-rear direction and from the direct current P bus bar 57 and the direct current N bus bar 58 to the PN terminal 4P, 4N in the left-right direction.

Next, the connection between the direct current P bus bar 57, the P terminal 4P, the direct current N bus bar 58, and the N terminal 4N will now be described. First, before connecting these elements, the power module 4 and the smoothing capacitor 5 are brought close to each other at the high-voltage connection portion 8. The distance between the power module 4 and the smoothing capacitor 5 is a distance for which space for a tool need not be considered (for example, approximately several millimeters).

Next, the vertical positions of the DC hole portion 44, the terminal side insertion hole 4H, and the bus bar side insertion hole 59 are matched. For example, as shown in FIG. 4, the vertical positions of the DC hole portion 44 of the power module 4, the terminal side insertion hole 4H of the U-phase P terminal 4P, and the bus bar side insertion hole 59 of the direct current P bus bar 57 are matched.

Next, the DC fastening bolt 43 is inserted into the bus bar side insertion hole 59 and the terminal side insertion hole 4H and bolted to the DC hole portion 44. That is, the direct current P bus bar 57 and the P terminal 4P are fastened to the power module 4 by the DC fastening bolt 43. In addition, the direct current N bus bar 58 and the N terminal 4N are fastened to the power module 4 by the DC fastening bolt 43.

Here, the position in which the direct current P bus bar 57 and the P terminal 4P are fastened to the power module 4 by the DC fastening bolt 43 and the position in which the direct current N bus bar 58 and the N terminal 4N are fastened to the power module 4 by the DC fastening bolt 43 are each defined as bus bar fastening point 9B. That is, in the first embodiment, six bus bar fastening points 9B are disposed.

Next, the detailed configuration of the capacitor fixing points according to the first embodiment will be described below with reference to FIG. 2. The capacitor fixing points 9C are provided at the outer peripheral positions of the three sides 5b (front/rear/left) out of the four sides 5b of the smoothing capacitor 5. That is, the capacitor fixing points 9C are disposed at positions that avoid corner portions 5a of the smoothing capacitor 5. The capacitor fixing points 9C are direct fixing points where the smoothing capacitor 5 is fixed to the case 30 with the capacitor fixing bolts 54.

In addition, the bus bar fastening points 9B are provided at the outer peripheral positions of the remaining one side 5b (right side) out of the four sides 5b of the smoothing capacitor 5. That is, the bus bar fastening points 9B are disposed at positions that avoid corner portions 5a of the smoothing capacitor 5.

Here, the direct current P bus bar 57 and the direct current N bus bar 58 and the PN terminal 4P, 4N are fastened to the power module 4 by the DC fastening bolt 43. As a result, the power module 4 and the smoothing capacitor 5 are electrically connected. In addition, the power module 4 is fixed to the case 30 by means of PM fixing bolts 41. Therefore, the bus bar fastening points 9B are indirect fixing points that are fixed to the case 30 via the power module 4.

In this manner, the bus bar fastening points 9B serve the purposes of both electrical connection as well as fastening the capacitor. In addition, with six bus bar fastening points 9B, it is possible to provide the same fastening ability as the capacitor fixing points 9C as direct fixing points. As a result, the bus bar fastening points 9B are set as a capacitor fixing point 9C. That is, as shown in FIG. 2, of the four capacitor fixing points 9C, the bus bar fastening points 9B are set as one of the two capacitor fixing points 9C arranged on a diagonal (opposite positions) in the left-right direction.

The actions are described next. "Action of problem generation" and "characteristic action of the inverter device" will be described separately regarding the actions of the inverter device 3A according to the first embodiment.

Action of Problem Generation

Figure 5:
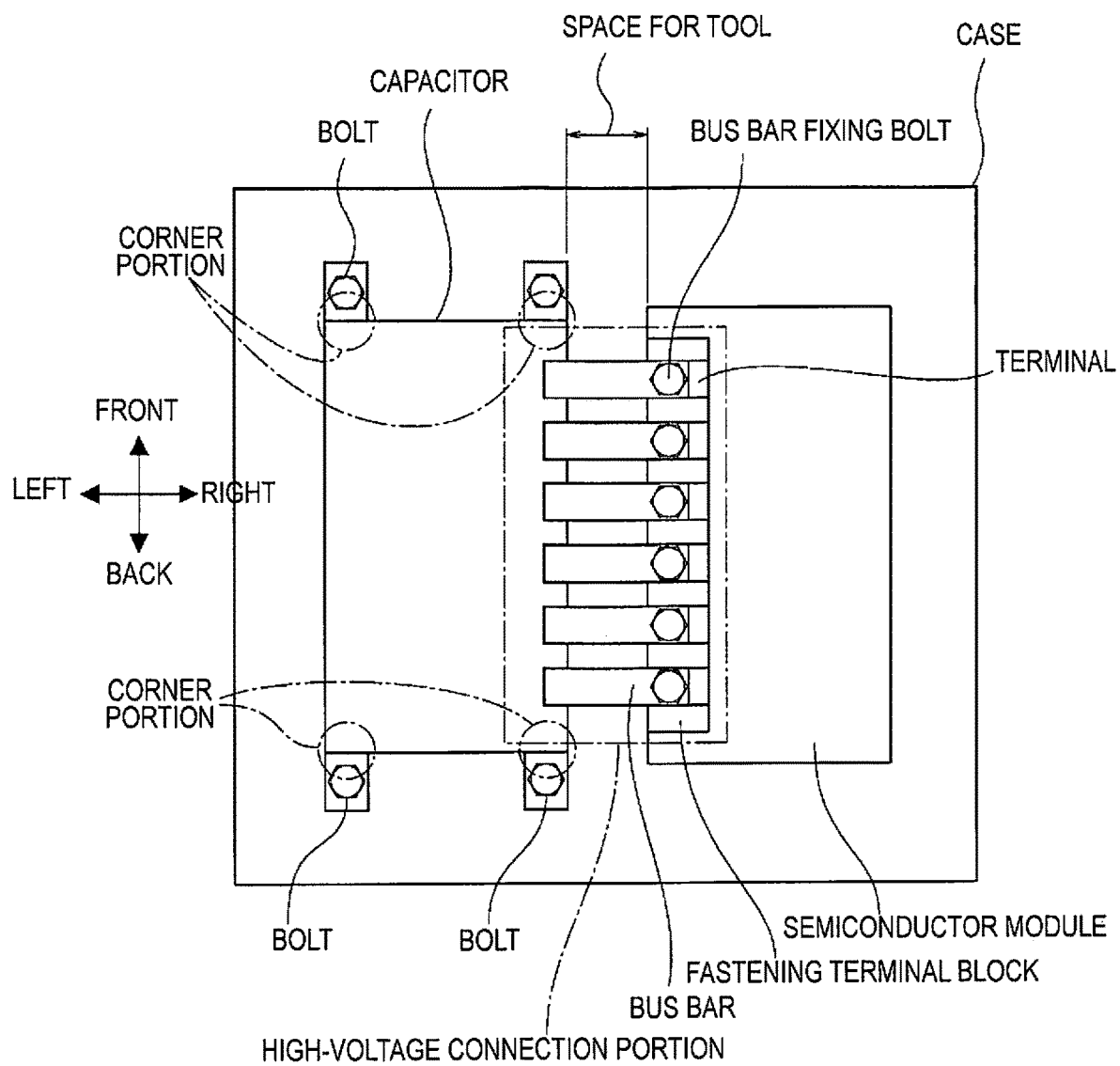
FIG. 5 is a plan view of an inverter device according to a conventional example.

FIG. 5 is a plan view of the inverter device according to a conventional example. The action of problem generation will be described with reference to FIG. 5.

Conventionally, in an inverter device, which is a type of power conversion device, a semiconductor module and a capacitor are arranged in adjacent positions. The capacitor is square in shape in a plan view and is fixed to the case of the inverter device by means of bolts. The bolts are fastened at the four corners of the capacitor.

However, in the conventional inverter device, since the four corners of the capacitor serve as capacitor fastening points by fastening bolts, a space for a tool must be provided between the semiconductor module and the capacitor. For this reason, there is the problem that the volume, and thus the size, of the inverter device will increase. For example, in FIG. 5, the volume, and thus the size, of the inverter device increases in the left-right direction of the inverter device in a plan view.

In addition, the length of the bus bar that extends from the capacitor is required to be a length that corresponds to the space for a tool. As a result, there is the problem that cost increases due to the increased length of the bus bar.

Characteristic Action of the Inverter Device

As described above, a space for a tool must be provided, which increases the size of the inverter device. In contrast, in the first embodiment, when the locations at which the smoothing capacitor 5 is fixed to the case 30 with the capacitor fixing bolts 54 at the capacitor fixing points 9C, the capacitor fixing points 9C are arranged at positions that avoid the corner portions 5a of the smoothing capacitor 5. In addition, the power module 4 and the smoothing capacitor 5 are brought close to each other at the high-voltage connection portion 8. That is, since the capacitor fixing points 9C are disposed in positions that avoid corner portions 5a of the smoothing capacitor 5, it is not necessary to provide the space for a tool between the power module 4 and the smoothing capacitor 5. For this reason, the distance between the power module 4 and the smoothing capacitor 5 is reduced. As a result, the inverter device 3A can be downsized (made compact).

In addition, if the electrical connection between the power module 4 and the smoothing capacitor 5 has a bus bar structure, it is possible to reduce the distance between the power module 4 and the smoothing capacitor 5. Therefore, the lengths of the direct current P bus bar 57 and the direct current N bus bar 58 that extend from the smoothing capacitor 5 are reduced. Thus, it is possible to reduce the cost of the direct current P bus bar 57 and the direct current N bus bar 58.

In the first embodiment, when the locations at which the direct current P bus bar 57 and the direct current N bus bar 58 are fastened to the power module 4 by the DC fastening bolts 43 are the bus bar fastening points 9B, the bus bar fastening points 9B serve the purposes of both electrical connection as well as fixing the capacitor. Thus, the bus bar fastening points 9B are set as a capacitor fixing point 9C.

For example, there are cases in which the number of capacitor fixing points decreases due to an arrangement of the capacitor fixing points that avoid the corner portions of the capacitor. That is, four-point fixing becomes three-point fixing. As a result, there is the risk that the strength with which the capacitor is fastened to the case will be reduced.

In addition, in the conventional inverter device, there has not been a disclosure in which a bus bar fastening point is set as a capacitor fixing point.

In contrast, in the first embodiment, the bus bar fastening points 9B serve the dual purpose of electrical connection and fixing of the capacitor. Thus, the bus bar fastening points 9B are configured to be capacitor fixing points 9C. That is, by setting the bus bar fastening points 9B as capacitor fixing points 9C, the number of the capacitor fixing points 9C does not decrease, and four-point fixing is achieved. Therefore, it is possible to secure the overall fastening strength of the capacitor fixing points 9C with respect to the smoothing capacitor 5.

In the first embodiment, the capacitor fixing point 9C is provided at the outer peripheral position of each side 5b of the smoothing capacitor 5. Then, of the capacitor fixing points 9C, the bus bar fastening points 9B are set as one of the two capacitor fixing points 9C arranged on a diagonal.

For example, a square smoothing capacitor is assumed, and capacitor fixing points are provided at the outer peripheral position of each side of the smoothing capacitor, making the configuration a four-point fixing. In this case, since all four points are direct fixing points, the overall fastening strength of the capacitor fixing points 9C with respect to the case is relatively high.

In contrast, in the first embodiment, of the capacitor fixing points 9C, the bus bar fastening points 9B are set as one of the two capacitor fixing points 9C arranged on a diagonal. That is, even if the bus bar fastening points 9B are set as one of the capacitor fixing points 9C, it is possible to maintain the fastening strength with respect to the case 30 equivalent to the case in which all four points are direct fixing points. Accordingly, it is possible to make the overall fastening strength of the capacitor fixing points 9C with respect to the case 30 equivalent to the fastening strength in which all four points are direct fixing points, while eliminating one of the capacitor fixing points 9C. In addition, only three capacitor fixing points 9C are needed.

In the first embodiment, the surface on which the direct current P bus bar 57 and the P terminal 4P are fastened and the surface on which the direct current N bus bar 58 and the N terminal 4N are fastened are the bus bar fastening surface 10. In addition, when the surface from which the direct current P bus bar 57 and the direct current N bus bar 58 extend out from the smoothing capacitor 5 is defined as the upper surface 51a, the height position of the bus bar fastening surface 10 is in a close position of the height position of the upper surface 51a. That is, by making the height positions of the bus bar fastening surface 10 and the upper surface 51a close, it is possible to decrease the distance between the direct current P bus bar 57 and the P terminal 4P and the distance between the direct current N bus bar 58 and the N terminal 4N. Therefore, the lengths of the direct current P bus bar 57 and the direct current N bus bar 58 that extend from the smoothing capacitor 5 are reduced. Accordingly, it is possible to further reduce the cost of the direct current P bus bar 57 and the direct current N bus bar 58.

In the first embodiment, the direct current P bus bar 57 and the direct current N bus bar 58 have the first bent portion 101 that extends upward from the upper surface 51a in the vertical direction and is bent in the middle in the horizontal direction (right side). The direct current P bus bar 57 and the direct current N bus bar 58 have a second bent portion 102 that extends from the first bent portion 101 in the horizontal direction and is bent downward in the middle in the vertical direction. The direct current P bus bar 57 and the direct current N bus bar 58 have a third bent portion 103 that extends from the second bent portion 102 in the vertical direction and is bent in the middle in the horizontal direction (right side) on the opposite side of the first bent portion 101 (opposite side of the direction in which the first bent portion 101 is positioned). The direct current P bus bar 57 and the direct current N bus bar 58 extend in the horizontal direction from the third bent portion 103 to the P terminal 4P of the power module 4.

For example, there are cases in which the power module 4 and the smoothing capacitor 5 are displaced relative to each other due to vibration of the motor/generator 11, or the like. In this case, since the direct current P bus bar 57 and the direct current N bus bar 58 have the first bent portion 101, the second bent portion 102, and the third bent portion 103, the relative displacement can be absorbed. In this case, the direct current P bus bar 57 and the direct current N bus bar 58 can avoid the concentration of stress at the bus bar fastening points 9B, compared to a bus bar that does not have bent portion or a bus bar that has only one bent portion. Thus, it is possible to improve the durability and reliability of the high-voltage connection portion 8.

The effects will now be described. The effects listed below can be obtained by the inverter device 3A of the first embodiment.

(1) The case 30, the semiconductor module (power module 4), the smoothing capacitor 5, and the high-voltage connection portion 8 are provided. The semiconductor module (power module 4) is housed in the case 30. The smoothing capacitor 5 is fixed to the case 30 by fixing bolts (capacitor fixing bolt 54) and suppresses voltage fluctuations. In the high-voltage connection portion 8, the semiconductor module (power module 4) and the smoothing capacitor 5 are electrically connected. When the locations at which the smoothing capacitor 5 is fixed to the case 30 by fixing bolts (capacitor fixing bolts 54) are the capacitor fixing points 9C, the capacitor fixing points 9C are arranged at positions that avoid the corner portions 5a of the smoothing capacitor 5. The semiconductor module (power module 4) and the smoothing capacitor 5 are brought close to each other at the high-voltage connection portion 8. For this reason, it is possible to provide the power conversion device (inverter device 3A) that can realize the downsizing of the power conversion device (inverter device 3A).

(2) The smoothing capacitor 5 has bus bars (direct current P bus bar 57 and the direct current N bus bar 58). At the high-voltage connection portion 8, the bus bars (direct current P bus bar 57 and the direct current N bus bar 58) and the semiconductor module (power module 4) are electrically connected by fastening bolts (DC fastening bolts 43). When the locations at which the bus bars (direct current P bus bar 57 and the direct current N bus bar 58) are fastened to the semiconductor module (power module 4) by the fastening bolts (DC fastening bolts 43) are the bus bar fastening points 9B, the bus bar fastening points 9B serve the dual purpose of electrical connection and fixing of the capacitor. The bus bar fastening points 9B are set as a capacitor fixing point 9C. For this reason, in addition to the effect of (1), it is possible to secure the overall fastening strength of the capacitor fixing points 9C with respect to the smoothing capacitor 5.

(3) The smoothing capacitor 5 is square in shape. The capacitor fixing point 9C is provided at the outer peripheral position of each side 5c of the smoothing capacitor 5. Of the capacitor fixing points 9C, the bus bar fastening points 9B are set as one of the two capacitor fixing points 9C arranged on a diagonal. For this reason, in addition to the effect of (2), it is possible to make the overall fastening strength of the capacitor fixing points 9C with respect to the case 30 equivalent to the fastening strength in which all four points are direct fixing points, while eliminating one of the capacitor fixing points 9C.

(4) The smoothing capacitor 5 has bus bars (direct current P bus bar 57 and the direct current N bus bar 58). The semiconductor module (power module 4) has a terminal (PN terminal 4P, 4N) that is fastened with the bus bars (direct current P bus bar 57 and the direct current N bus bar 58). The surface on which the terminal (PN terminal 4P, 4N) and the bus bars (direct current P bus bar 57 and the direct current N bus bar 58) are fastened is defined as the bus bar fastening surface 10. Then, when the surface from which the bus bars extend out from the smoothing capacitor 5 is defined as the extension surface (upper surface 51a), the height position of the bus bar fastening surface 10 is in a close position of the height position of the extension surface (upper surface 51a). Therefore, in addition to the effects of (1) to (3), it is possible to further reduce the cost of the direct current P bus bar 57 and the direct current N bus bar 58.

(5) The surface from which the bus bars (direct current P bus bar 57 and the direct current N bus bar 58) extend out from the smoothing capacitor 5 is defined as the extension surface (upper surface 51a). In this case, the bus bars (direct current P bus bar 57 and direct current N bus bar 58) have the first bent portion 101 that extends upward from the extension surface (upper surface 51a) in the vertical direction and is bent in the middle in the horizontal direction (right side). In addition, the bus bars (direct current P bus bar 57 and direct current N bus bar 58) have a second bent portion 102 that extends from the first bent portion 101 in the horizontal direction and is bent downward in the middle in the vertical direction. Moreover, the bus bars (direct current P bus bar 57 and direct current N bus bar 58) have a third bent portion 103 that extends from the second bent portion 102 in the vertical direction and that is bent in the middle in the horizontal direction (right side) on the opposite side of the first bent portion 101. The bus bars (direct current P bus bar 57 and direct current N bus bar 58) extend in the horizontal direction from the third bent portion 103 to the terminal (PN terminal 4P, 4N) of the semiconductor module (power module 4). For this reason, in addition to the effects of (2) to (4), it is possible to improve the durability and reliability of the high-voltage connection portion 8.

Second Embodiment

The second embodiment is an example in which two power modules are electrically connected to one smoothing capacitor, and, of the capacitor fixing points, two capacitor fixing points arranged on a diagonal both serve as bus bar fastening points.

The configuration will be described first. The power conversion device according to the second embodiment is applied to an inverter device (one example of a power conversion device) of a motor/generator that is mounted in a range extended electric vehicle (one example of an electrically driven vehicle) as a travel drive source, or the like. The range extended electric vehicle (EV) has two motor/generators and an engine dedicated to power generation. The range extended electric vehicle uses one of the two motor/generators for travel and the other one for power generation. Power generation is carried out by means of a regenerative operation of the motor/generator for driving and the motor/generator for power generation using the engine as the drive source. In addition, when a configuration having two purposes, driving and power generation (for example, power module 4), is described, when neither driving nor power generation is referred to specifically, the description is respect to what is common to both configurations, driving use and power generation. The "circuit configuration of the drive system," the "configuration of the inverter device," and the "configuration of the main components" will be separately described below regarding the configuration of the second embodiment.

Circuit Configuration of the Drive System

Figure 6:
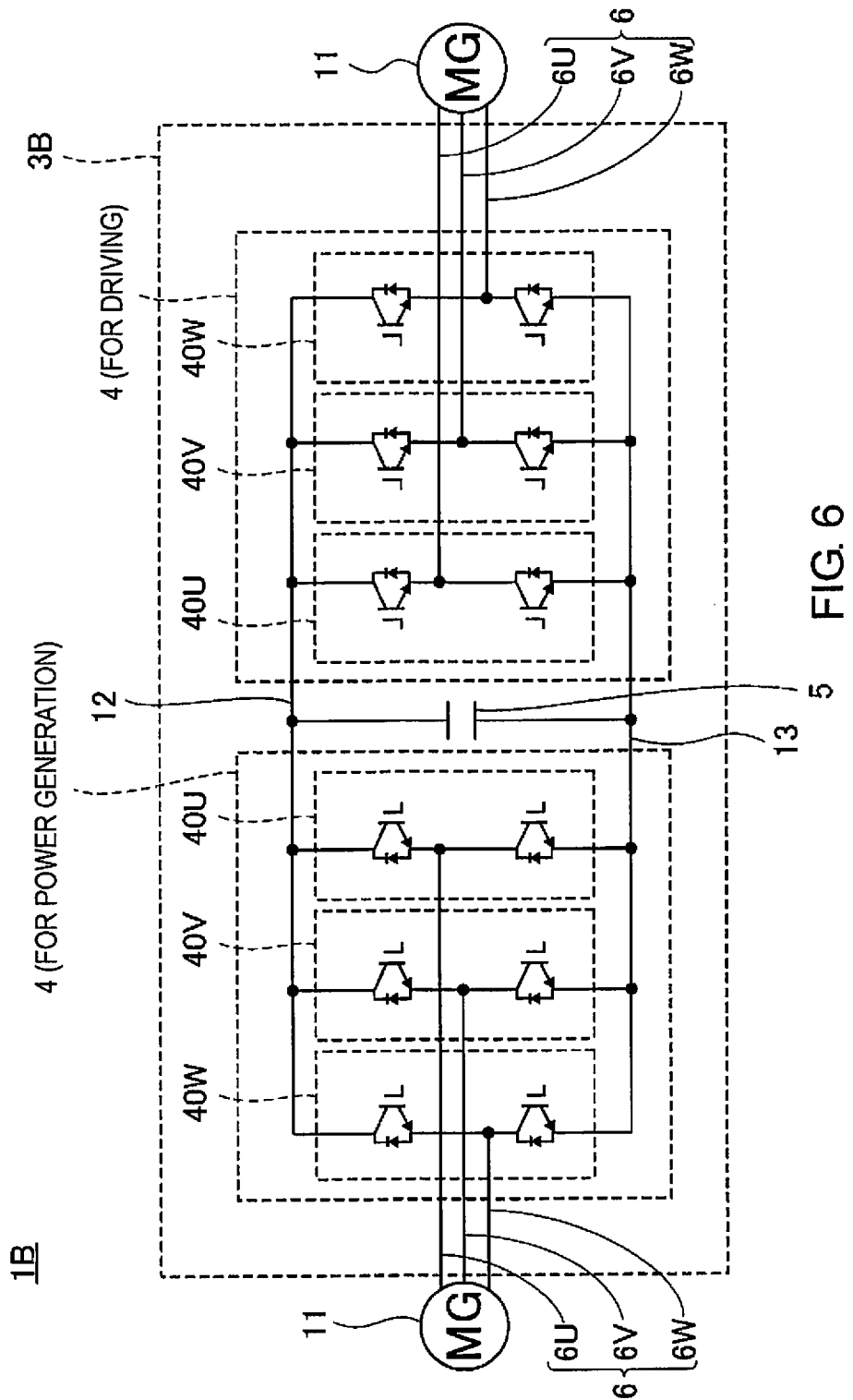
FIG. 6 is a circuit diagram of a drive system of a range extended electric vehicle to which an inverter device according to a second embodiment is applied.

FIG. 6 illustrates a circuit diagram of a drive system of an electric vehicle to which an inverter device according to the second embodiment is applied. The circuit configuration of the drive system according to the second embodiment will be described below with reference to FIG. 6.

The drive system 1B comprises an inverter device 3B and two motor/generators 11, one for driving and one for power generation. The illustration and description of the DC power source 2 (high-power battery) have been omitted. In addition, the drive system 1B is obtained by adding the motor/generator 11 for power generation to the drive system 1A of the first embodiment.

The inverter device 3B converts DC power supplied from the DC power source 2 into AC power and outputs the converted electric power to the motor/generator 11 for driving. In addition, the inverter device 3B converts the AC power generated by the motor/generators 11 for driving and for power generation into the DC power and outputs the converted electric power to the DC power source 2. The inverter device 3B includes two power modules 4 (semiconductor modules) for driving and for power generation, one smoothing capacitor 5, and two three-phase lines 6 for driving and for power generation. The inverter device 3B is obtained by adding the power module 4 for power generation and the three-phase line 6 for power generation to the inverter device 3A of the first embodiment. In addition, the three-phase line 6 for power generation is the same as the three-phase line 6 of the first embodiment.

The power module 4 for power generation converts the DC power of the regenerative power (AC power) of the motor/generator 11 by means of a regenerative operation of the motor/generator 11 for power generation, which is supplied to the DC power source 2; thus, the DC power source 2 is charged by the regenerative power of the motor/generator 11. The other configurations are the same as those of the power module 4 of the first embodiment.

The smoothing capacitor 5 smooths the input/output voltages of the DC side of the U, V, and W phase arm circuits 40U, 40V, 40W provided in the two power modules 4 for driving and for power generation. That is, one smoothing capacitor 5 smooths the input/output voltages of the two power modules 4.

The motor/generator 11 for power generation is a synchronous motor, for example, with a permanent magnet embedded in the rotor and a stator coil wound around the stator. The motor/generator 11 generates power using an engine, which is not shown, as a power source. For this reason, motor/generator 11 for power generation carries out regenerative operation using the engine as a power source.

The other configurations are the same as the "Circuit configuration of the drive system" of the first embodiment, so that the corresponding configurations have been assigned the same reference symbols and their descriptions have been omitted. In addition, illustrations and descriptions of configurations not illustrated in FIG. 6 have been omitted.

Configuration of the Inverter Device

Figure 7:
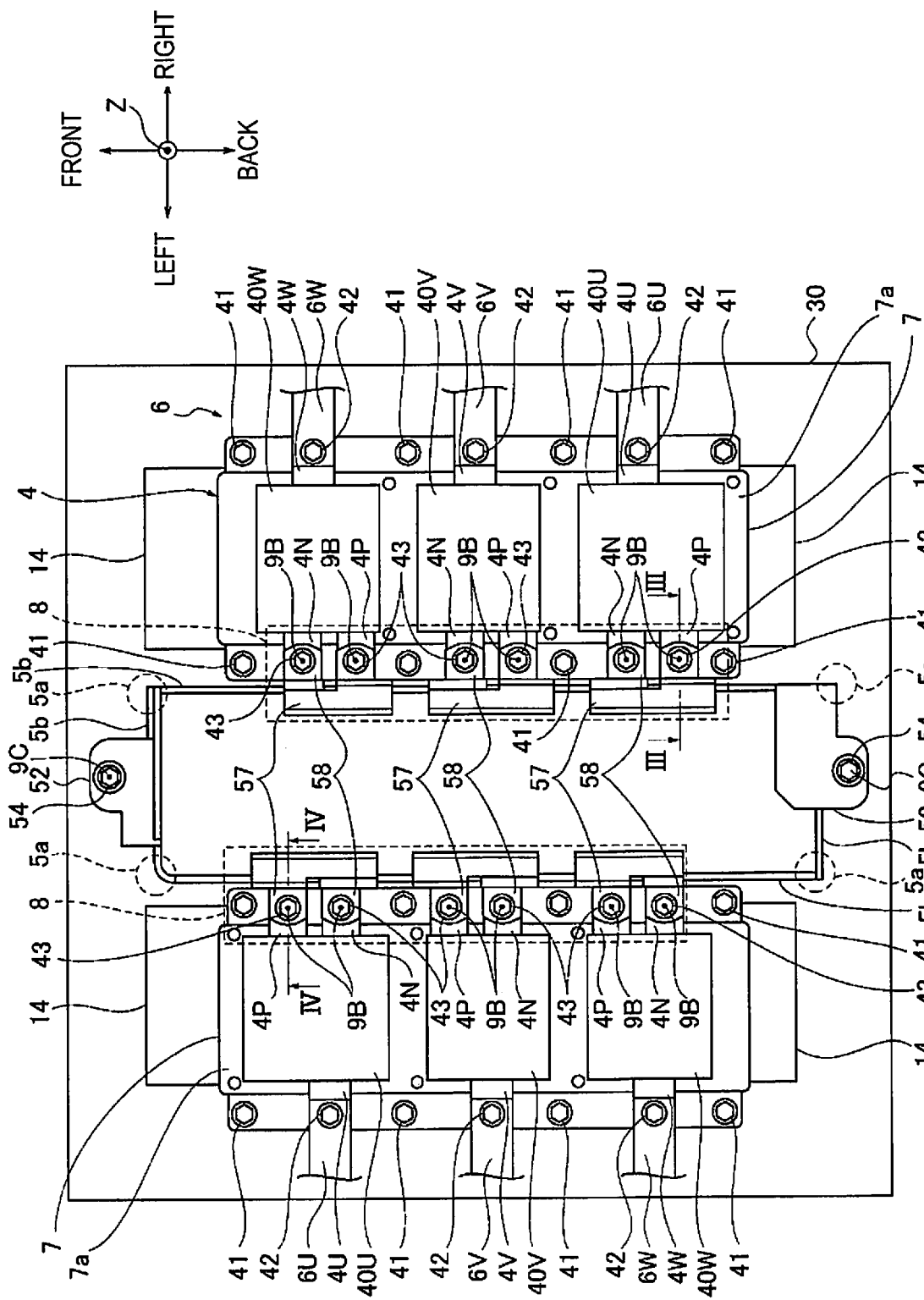
FIG. 7 is a plan view of the inverter device according to the second embodiment.

FIG. 7 is a plan view of the inverter device according to the second embodiment. The inverter device 3B according to the second embodiment will be described below with reference to FIG. 7.

The inverter device 3B has a case 30 for housing the power module 4, and the like. FIG. 7 shows only the bottom surface of the case 30. The case 30 is disposed, for example, at a position above the two motor/generators 11 for driving and for power generation. The two power modules 4 for driving and for power generation, the one smoothing capacitor 5, and the two three-phase lines 6 for driving and for power generation are housed inside the case 30. The two circuit boards 7 for driving and for power generation, two high-voltage connection portions 8 for driving and for power generation, the P bus bar 12, the N bus bar 13, and two coolers 14 for driving and for power generation are also housed inside the case 30.

The power modules 4 are arranged parallel to the smoothing capacitor 5 and are fixed to the coolers 14 by PM fixing bolts 41. The power module 4 for driving is disposed on the right side of the smoothing capacitor 5, and the power module 4 for power generation is disposed on the left side of the smoothing capacitor 5. In addition, the cooler 14 is provided below the circuit board 7 in the Z direction (direction orthogonal to the plane of the paper in FIG. 7, vertical direction). The cooler 14 is fixed to the case 30 by means of cooler fixing bolts, not shown. In the same manner as in the first embodiment, the cooler 14 has a refrigerant flow path through which a refrigerant (such as cooling water) flows. Illustrations and descriptions of the refrigerant inflow path and the refrigerant outflow path that connect the cooler 14 to the outside have been omitted.

Although the arrangements of the U, V, and W phase arm circuits 40U, 40V, 40 W of the two power modules 4 for driving and for power generation are different, the description of the specific configuration is the same as in the first embodiment. That is, with the smoothing capacitor 5 in the middle, the configurations for power generation, that is, the power module 4 for power generation and other configurations for power generation, are disposed on the left side, and the configurations for driving, that is, the power module 4 for driving and other configurations for driving are disposed on the right side. The electrical connections between the power modules 4 and the motor/generators 11 are the same as in the first embodiment; that is, the components for driving are interconnected, and the components for power generation are interconnected.

The smoothing capacitor 5 is disposed between the two power modules 4 for driving and for power generation. That is, the two power modules 4 are disposed on the two sides of the smoothing capacitor 5. Here, the portion where the power module 4 for driving and the smoothing capacitor 5 are electrically connected is the high-voltage connection portion 8 for driving (right side of the smoothing capacitor 5). In addition, the portion where the power module 4 for power generation and the smoothing capacitor 5 are electrically connected is the high-voltage connection portion 8 for power generation (left side of the smoothing capacitor 5). Although illustrations of the power source P bus bar 55 and the power source N bus bar 56 have been omitted, the power source P bus bar 55 and the power source N bus bar 56 are connected to the DC power source 2.

The other configurations are the same as the "Configuration of the inverter device" in the first embodiment, so that the corresponding configurations have been assigned the same reference symbols and the descriptions thereof have been omitted. In addition, illustrations and descriptions of configurations not illustrated in FIG. 7 have been omitted.

Configuration of the Main Components

The main components of the second embodiment will be described below with reference to FIGS. 4 and 7.

The smoothing capacitor 5 includes the rectangular parallelepiped capacitor body 51, two capacitor fixing portions 52, the direct current P bus bar 57, and the direct current N bus bar 58. Illustrations and descriptions of the power source P bus bar 55 and the power source N bus bar 56 have been omitted.

As shown in FIGS. 2 and 3, one each of the capacitor fixing portions 52 is provided at the outer peripheral position of each of the front and rear sides 5b of the capacitor body 51. The capacitor fixing portions 52 are provided at the outer peripheral positions of the two sides 5b from among the four sides 5b of the smoothing capacitor 5. That is, the capacitor fixing portions 52 are disposed at positions that avoid corner portions 5a of the smoothing capacitor 5.

As shown in FIG. 7, the direct current P bus bar 57 and the direct current N bus bar 58 extend respectively out from the left side and the right side of the upper surface 51a of the capacitor body 51. The direct current P bus bar 57 and the direct current N bus bar 58 extend out from the left side to the left side for power generation. That is, the direct current P bus bar 57 and the direct current N bus bar 58 on the left side extend from the smoothing capacitor 5 to the power module 4 for power generation. The direct current P bus bar 57 and the direct current N bus bar 58 extend out from the right side to the right side for driving. That is, the direct current P bus bar 57 and the direct current N bus bar 58 on the right side extend from the smoothing capacitor 5 to the power module 4 for driving. In addition, three each of the left and right direct current P bus bars 57 and the direct current N bus bars 58 extend out corresponding to each of the U, V, and W phases.

The shapes of the direct current P bus bar 57 and the direct current N bus bar 58 disposed on the right side are the same as the shapes of the direct current P bus bar 57 and the direct current N bus bar 58 of the first embodiment. On the other hand, the shapes of the direct current P bus bar 57 and the direct current N bus bar 58 disposed on the left side are such that the direction of being bent in the horizontal direction is opposite in the left-right direction compared to the shapes of the direct current P bus bar 57 and the direct current N bus bar 58 of the first embodiment. That is, the direct current P bus bar 57 and the direct current N bus bar 58 disposed on the left side have the first bent portion 101 that extends upward from the upper surface 51a in the vertical direction and that is bent in the middle in the horizontal direction (left side). The same applies to the third bent portion 103.

The electrical connection between the PN terminal 4P, 4N and the direct current P bus bar 57 and the direct current N bus bar 58, respectively, is the same as in the first embodiment, namely, the components for driving are interconnected, and the components for power generation are interconnected. In addition, before these elements are connected, the power module 4 for driving and the smoothing capacitor 5 are brought close to each other at the high-voltage connection portion 8 for driving. The power module 4 for power generation and the smoothing capacitor 5 are then brought close to each other at the high-voltage connection portion 8 for power generation. The distance between the power module 4 for driving and the smoothing capacitor 5, and the distance between the power module 4 for power generation and the smoothing capacitor 5 are distances for which space for a tool need not be considered (for example, about several millimeters). In the same manner as in the first embodiment, the direct current P bus bar 57 and the P terminal 4P are then connected to the direct current N bus bar 58 and the N terminal 4N.

Here, the bus bar fastening points 9B of the second embodiment will be described. The bus bar fastening points 9B according to the second embodiment are disposed on both the left and right sides of the smoothing capacitor 5. Six bus bar fastening points 9B are disposed on each of the two sides.

Next, the detailed configuration of the capacitor fixing points according to the second embodiment will be described below with reference to FIG. 7. The capacitor fixing points 9C are provided at the outer peripheral positions and the central portions of the two sides 5b (front/rear) out of the four sides 5b of the smoothing capacitor 5. That is, the capacitor fixing points 9C are disposed at positions that avoid corner portions 5a of the smoothing capacitor 5. The capacitor fixing points 9C are direct fixing points at which the smoothing capacitor 5 is fixed to the case 30 by the capacitor fixing bolts 54.

In addition, the bus bar fastening points 9B are provided at the outer peripheral positions of the remaining two sides 5b (left side/right side) out of the four sides 5b of the smoothing capacitor 5. That is, the bus bar fastening points 9B are disposed at positions that avoid the corner portions 5a of the smoothing capacitor 5.

Here, the direct current P bus bar 57 and the direct current N bus bar 58 and the PN terminal 4P, 4N are fastened to the power module 4 by the DC fastening bolt 43. As a result, the power module 4 and the smoothing capacitor 5 are electrically connected. In addition, the power module 4 is fixed to the cooler 14 by means of PM fixing bolts 41. Moreover, the cooler 14 is fixed to the case 30 by means of cooler fixing bolts, which are not shown. Therefore, the bus bar fastening points 9B are indirect fixing points that are fixed to the case 30 via the power module 4 and the cooler 14.

In this manner, the bus bar fastening points 9B serve the purposes of both electrical connection and of fixing the capacitor. In addition, with six bus bar fastening points 9B disposed each to the left and to the right, it is possible to provide the same fastening capability as the capacitor fixing points 9C as direct fixing points. As a result, the bus bar fastening points 9B are set as a capacitor fixing point 9C. That is, as shown in FIG. 2, of the four capacitor fixing points 9C, the bus bar fastening points 9B are set as both of the two capacitor fixing points 9C arranged on a diagonal (opposite positions) in the left-right direction.

The other configurations are the same as the "Configuration of the main components" in the first embodiment, so that the corresponding configurations have been assigned the same reference symbols and the descriptions thereof have been omitted. In addition, illustrations and descriptions of configurations not illustrated in FIG. 7 have been omitted.

The actions are described next. "Action of problem generation" will be described in regard to the action of the inverter device 3B according to the second embodiment in the same manner as in the first embodiment. Therefore, illustrations and descriptions have been omitted. Regarding the inverter device 3B according to the second embodiment, only the "characteristic action of the inverter device" will be described below, unlike the first embodiment.

In the second embodiment, the capacitor fixing point 9C is provided at the outer peripheral position of each side 5b of the smoothing capacitor 5. Of the capacitor fixing points 9C, the bus bar fastening points 9B are set as both of the two capacitor fixing points 9C arranged on a diagonal.

For example, a square smoothing capacitor is assumed, and capacitor fixing points are provided at the outer peripheral position of each side of the smoothing capacitor, a four-point fixing configuration. In this case, since all four points are direct fixing points, the overall fastening strength of the capacitor fixing points 9C with respect to the case is relatively high.

In contrast, in the second embodiment, of the capacitor fixing points 9C, the bus bar fastening points 9B are set as both of the two capacitor fixing points 9C arranged on a diagonal. That is, even if the bus bar fastening points 9B are set as two of the capacitor fixing points 9C, it is possible to maintain the fastening strength with respect to the case 30 to be equivalent to the case in which all four points are direct fixing points. Accordingly, it is possible to make the overall fastening strength of the capacitor fixing points 9C with respect to the case 30 equivalent to the fastening strength in which all four points are direct fixing points, while eliminating two of the capacitor fixing points 9C. In addition, only two capacitor fixing points 9C are required.

In addition, if, for example, one motor/generator were to be added to the first embodiment, one power module and one smoothing capacitor would need to be newly provided. This would increase the volume, and thus the size, of the inverter device.

In contrast, in the second embodiment, the smoothing capacitor 5 for smoothing the input/output voltages is shared between the two power modules 4.

In addition, if the smoothing capacitor 5 is simply shared, as described in "action of problem generation" of the first embodiment, when the four corner portions of the smoothing capacitor are to be bolted, a space for a tool must be provided between the semiconductor module and the capacitor. This would increase the volume, and thus the size, of the inverter device.

In contrast, according to the second embodiment, in the inverter device 3B having the two power modules 4 and the one smoothing capacitor 5, the capacitor fixing points 9C are disposed in positions that avoid the corner portions 5a of the smoothing capacitor 5. In addition, the two power modules 4 and the smoothing capacitor 5 are brought close to each other at the high-voltage connection portions 8. That is, since the capacitor fixing points 9C are disposed at positions that avoid the corner portions 5a of the smoothing capacitor 5, it is not necessary to provide space for a tool between the two power modules 4 and the smoothing capacitor 5. For this reason, the distance between the power module 4 for driving and the smoothing capacitor 5, and the distance between the power module 4 for power generation and the smoothing capacitor 5 are reduced. Accordingly, the inverter device 3B can be downsized (made compact).

In this manner, in the second embodiment, in a configuration having the two power modules 4, the one smoothing capacitor 5 is shared. In addition, in the second embodiment, the two power modules 4 and the smoothing capacitor 5 are brought close to each other at the high-voltage connection portions 8. The inverter device 3B can thus be downsized (made compact). In addition, only two capacitor fixing points 9C are required.

The effects will now be described. The effects listed in (1), (2), (4), and (5) of the first embodiment can be obtained by the inverter device 3B of the second embodiment. In addition, the effect (6) listed below can be obtained by the inverter device 3B of the second embodiment.

(6) The smoothing capacitor 5 is square in shape. The capacitor fixing point 9C is provided at the outer peripheral position of each side 5b of the smoothing capacitor 5. Of the capacitor fixing points 9C, the bus bar fastening points 9B are set as both of the two capacitor fixing points 9C arranged on a diagonal. Therefore, in addition to the effect of (2) above, it is possible to make the overall fastening strength of the capacitor fixing points 9C with respect to the case 30 equivalent to the fastening strength in which all four points are direct fixing points, while eliminating two of the capacitor fixing points 9C.

The power conversion device of the present invention was described above based on the first and second embodiments, but specific configurations thereof are not limited to these embodiments, and various modifications and additions to the design can be made without departing from the scope of the invention according to each claim in the Claims.

In the first and second embodiments, examples were shown in which the bus bar fastening points 9B are provided at the outer peripheral position of at least one side 5b out of the four sides 5b of the smoothing capacitor 5. However, the invention is not limited in this way. For example, the capacitor fixing point may be disposed at the outer peripheral position of each side of the smoothing capacitor and all four points made direct fixing points. The effect described in (1) above can be obtained with this type of configuration.

In the first embodiment, an example was shown in which the capacitor fixing points 9C are provided at the outer peripheral positions and the central portions of the three sides 5b (front/rear/left) out of the four sides 5b of the smoothing capacitor 5. In addition, in the second embodiment, an example was shown in which the capacitor fixing points 9C are provided at the outer peripheral positions and the central portions of the two sides 5b (front/rear) out of the four sides 5b of the smoothing capacitor 5. However, the invention is not limited in this way. For example, the capacitor fixing points 9C may be provided in portions other than the outer peripheral positions and the central portions of the sides 5b of the smoothing capacitor 5. In short, the capacitor fixing points 9C need only be provided at the outer peripheral position of each of the sides 5b of the smoothing capacitor 5. The effect described in (3) or (6) above can be obtained with this type of configuration.

In the first and second embodiments, examples were shown in which the height position of the upper surface 51a is a close position (nearby position) of the height position of the bus bar fastening surface 10. However, the invention is not limited in this way. For example, the height position of the bus bar fastening surface may be the same position as the height position of the upper surface (the same position 10A in FIG. 4). In other words, it is sufficient if the height position of the bus bar fastening surface is the same position or a nearby position as the height position of the upper surface. Specifically, the height position of the bus bar fastening surface may be the same position 10A as the height position of the upper surface, or may be any height position within the range from the upper nearby position 10B to the lower nearby position 10C. The effect described in (4) above can be obtained with this type of configuration.

In the first and second embodiments, the direct current P bus bar 57 and the direct current N bus bar 58 have the first bent portion 101 that extends upward from the upper surface 51a in the vertical direction and that is bent in the middle in the horizontal direction (right side). The direct current P bus bar 57 has a second bent portion 102 that extends from the first bent portion 101 in the horizontal direction and that is bent downward in the middle in the vertical direction. The direct current P bus bar 57 has a third bent portion 103 that extends from the second bent portion 102 in the vertical direction and that is bent in the middle in the horizontal direction (right side) on the opposite side of the first bent portion 101 (opposite side of the direction in which the first bent portion 101 is positioned). An example was shown in which the direct current P bus bar 57 extends in the horizontal direction from the third bent portion 103 to the P terminal 4P of the power module 4. However, the invention is not limited in this way. For example, the shape of the direct current P bus bar and the direct current N bus bar may be such that a first bent portion extends upward from the upper surface in the vertical direction and is bent in the middle in the horizontal direction. The direct current P bus bar and the direct current N bus bar may extend in the horizontal direction from the first bent portion to the P terminal and the N terminal of the power module.

In the first and second embodiments, examples were shown in which the power conversion device according to the present disclosure is applied to the inverter devices 3A, 3B that are used as an AC/DC conversion device of the motor/generator 11. However, the power conversion device according to the present disclosure may be applied to various power conversion devices besides an inverter device, as long as the power conversion device comprises a semiconductor module, a smoothing capacitor, and a high-voltage connection portion. Moreover, the invention is not limited to an inverter device that is mounted in an electrically driven vehicle, such as an electric vehicle (one example of an electrically driven vehicle).

The invention claimed is:

1. A power conversion device comprising:
   a case;
   a semiconductor module that is housed in and fixed to the case;
   a smoothing capacitor that is disposed in parallel with the semiconductor module in a side-by-side configuration, that is directly fixed to the case by fixing bolts and that suppresses voltage fluctuations, the semiconductor module and the smoothing capacitor being directly fixed to a same surface of the case, and the semiconductor module and the smoothing capacitor being housed in the case; and
   a high-voltage connection portion to which the semiconductor module and the smoothing capacitor are electrically connected,
   locations at which the smoothing capacitor is fixed to the case by the fixing bolts correspond to capacitor fixing points, the capacitor fixing points being arranged at positions that avoid corner portions of the smoothing capacitor, and
   the smoothing capacitor having a bus bar that is electrically connected by fastening bolts at bus bar fastening points to the high-voltage connection portion, the bus bar extending from an upper surface of the smoothing capacitor in a vertical direction, the bus bar having a plurality of bent portions,
   the bus bar fastening points serving both as electrical connections and as the capacitor fixing points.

2. The power conversion device according to claim 1, wherein
   the smoothing capacitor is square in shape,
   one of the capacitor fixing points is provided at an outer peripheral position at each side of the smoothing capacitor, and
   among the capacitor fixing points one or both of two of the capacitor fixing points arranged in opposing positions are set as the bus bar fastening points.

3. The power conversion device according to claim 2, wherein
the semiconductor module has a terminal that is fastened to the bus bar, and
a surface on which the terminal and the bus bar are fastened correspond to a bus bar fastening surface and a surface on which the bus bar extends out from the smoothing capacitor correspond to an extension surface, a height position of the bus bar fastening surface is a same position or an adjacent position of a height position of the extension surface.

4. The power conversion device according to claim 2, wherein
the plurality of bent portions of the bus bar has includes
a first bent portion that extends upward from the upper surface in a vertical direction and that is bent in a middle in a horizontal direction,
a second bent portion that extends from the first bent portion in the horizontal direction and that is bent downward in a middle in the vertical direction, and
a third bent portion that extends from the second bent portion in the vertical direction and that is bent in a middle in the horizontal direction on an opposite side of the first bent portion, and
the third bent portion extends in the horizontal direction to a terminal of the semiconductor module.

5. The power conversion device according to claim 1, wherein
the semiconductor module has a terminal that is fastened to the bus bar, and
a surface on which the terminal and the bus bar are fastened corresponds to a bus bar fastening surface and a surface on which the bus bar extends out from the smoothing capacitor corresponds to an extension surface, a height position of the bus bar fastening surface is a same position or an adjacent position of a height position of the extension surface.

6. The power conversion device according to claim 5, wherein
the plurality of bent portions of the bus bar has includes
a first bent portion that extends upward from the upper surface in a vertical direction and that is bent in a middle in a horizontal direction,
a second bent portion that extends from the first bent portion in the horizontal direction and that is bent downward in a middle in the vertical direction, and
a third bent portion that extends from the second bent portion in the vertical direction and that is bent in a middle in the horizontal direction on an opposite side of the first bent portion, and
the third bent portion extends in the horizontal direction to a terminal of the semiconductor module.

7. The power conversion device according to claim 1, wherein
the bus bar extends out from an extension surface of the smoothing capacitor,
the bus bar has
a first bent portion that extends upward from the extension surface in a vertical direction and that is bent in a middle in a horizontal direction,
a second bent portion that extends from the first bent portion in the horizontal direction and that is bent downward in a middle in the vertical direction, and
a third bent portion that extends from the second bent portion in the vertical direction and that is bent in a middle in the horizontal direction on an opposite side of the first bent portion, and
the third bent portion extends in the horizontal direction to a terminal of the semiconductor module.

8. The power conversion device according to claim 1, wherein
the fixing bolts are disposed outside the high-voltage connection portion.

9. The power conversion device according to claim 1, wherein
the plurality of bent portions of the bus bar includes
a first bent portion that extends upward from the upper surface in a vertical direction and that is bent in a middle in a horizontal direction,
a second bent portion that extends from the first bent portion in the horizontal direction and that is bent downward in a middle in the vertical direction, and
a third bent portion that extends from the second bent portion in the vertical direction and that is bent in a middle in the horizontal direction on an opposite side of the first bent portion, and
the third bent portion extends in the horizontal direction to a terminal of the semiconductor module.

* * * * *